US012772515B2

(12) United States Patent
Nakano

(10) Patent No.: US 12,772,515 B2
(45) Date of Patent: Oct. 20, 2026

(54) SEMICONDUCTOR DEVICE AND SEMICONDUCTOR MODULE

(71) Applicant: FUJI ELECTRIC CO., LTD., Kawasaki (JP)

(72) Inventor: Hayato Nakano, Kofu-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 849 days.

(21) Appl. No.: 18/187,683

(22) Filed: Mar. 22, 2023

(65) Prior Publication Data

US 2023/0223441 A1 Jul. 13, 2023

Related U.S. Application Data

(63) Continuation of application No. PCT/JP2022/007182, filed on Feb. 22, 2022.

(30) Foreign Application Priority Data

Apr. 14, 2021 (JP) ................................ 2021-068348

(51) Int. Cl.
*H01L 29/06* (2006.01)
*H10D 8/00* (2025.01)
(Continued)

(52) U.S. Cl.
CPC ............ *H10D 62/127* (2025.01); *H10D 8/00* (2025.01); *H10D 12/481* (2025.01);
(Continued)

(58) Field of Classification Search
CPC ...... H10D 62/127; H10D 8/00; H10D 12/481; H10D 8/422; H10D 62/129; H10D 64/117;
(Continued)

(56) References Cited

U.S. PATENT DOCUMENTS

2008/0048295 A1 2/2008 Takahashi
2014/0299979 A1 10/2014 Danno
(Continued)

FOREIGN PATENT DOCUMENTS

CN 112349766 A 2/2021
JP 2008053648 A 3/2008
(Continued)

OTHER PUBLICATIONS

International Search Report and (ISA/237) Written Opinion of the International Search Authority for International Patent Application No. PCT/JP2022/007182, mailed by the Japan Patent Office on Apr. 5, 2022.

(Continued)

*Primary Examiner* — Cuong B Nguyen

(57) ABSTRACT

Provided is a semiconductor device including: a transistor portion provided in a semiconductor substrate; and a diode portion provided in the semiconductor substrate, in which an area ratio of the transistor portion to the diode portion on a front surface of the semiconductor substrate is larger than 3.1 and smaller than 4.7. Provided is a semiconductor module including: a semiconductor device including a transistor portion and a diode portion provided in a semiconductor substrate; an external connection terminal electrically connected to the semiconductor device; and a coupling portion for electrically connecting the semiconductor device and the external connection terminal. The coupling portion may be in plane contact with a front surface electrode of the semiconductor device at a predetermined junction surface. An area ratio of the transistor portion to the diode portion may be larger than 2.8 and smaller than 4.7.

20 Claims, 16 Drawing Sheets

(51) Int. Cl.

| | |
|---|---|
| ***H10D 12/00*** | (2025.01) |
| ***H10D 62/10*** | (2025.01) |
| *H10W 72/00* | (2026.01) |
| *H10W 72/30* | (2026.01) |
| *H10W 72/60* | (2026.01) |
| *H10W 72/90* | (2026.01) |
| *H10W 90/00* | (2026.01) |

(52) U.S. Cl.
CPC ........ *H10W 72/352* (2026.01); *H10W 72/622* (2026.01); *H10W 72/634* (2026.01); *H10W 72/646* (2026.01); *H10W 72/652* (2026.01); *H10W 72/655* (2026.01); *H10W 72/886* (2026.01); *H10W 72/952* (2026.01); *H10W 90/734* (2026.01); *H10W 90/761* (2026.01)

(58) Field of Classification Search
CPC .... H10D 62/142; H10D 84/811; H01L 24/05; H01L 24/37; H01L 24/40; H01L 24/29; H01L 24/32; H01L 24/73; H01L 2224/05624; H01L 2224/05638; H01L 2224/05647; H01L 2224/29111; H01L 2224/2912; H01L 2224/29147; H01L 2224/32225; H01L 2224/37012; H01L 2224/37124; H01L 2224/37147; H01L 2224/37565; H01L 2224/37655; H01L 2224/40153; H01L 2224/40499; H01L 2224/73263; H01L 2924/01014; H01L 2924/01029; H01L 2924/01033; H01L 2924/0105; H01L 2924/01051; H01L 2924/0132; H01L 2924/014; H01L 2924/10253; H01L 2924/10272; H01L 2924/1033; H01L 2924/12036; H01L 2924/13055; H01L 2224/40; H10W 72/352; H10W 72/622; H10W 72/634; H10W 72/646; H10W 72/652; H10W 72/655; H10W 72/886; H10W 72/952; H10W 90/734; H10W 90/761; H10W 72/07651; H10W 72/60
See application file for complete search history.

(56) References Cited

U.S. PATENT DOCUMENTS

| | | | |
|---|---|---|---|
| 2019/0287964 A1* | 9/2019 | Yamano | H10D 84/406 |
| 2019/0355718 A1* | 11/2019 | Nakano | H01L 23/49562 |
| 2021/0043758 A1 | 2/2021 | Yokoyama | |
| 2021/0384190 A1 | 12/2021 | Umeki | |

FOREIGN PATENT DOCUMENTS

| | | | |
|---|---|---|---|
| JP | 2014086536 | A | 5/2014 |
| JP | 2019186309 | A | 10/2019 |
| JP | 2021028930 | A | 2/2021 |
| WO | 2018225571 | A1 | 12/2018 |
| WO | 2020080476 | A1 | 4/2020 |

OTHER PUBLICATIONS

Noriyuki Iwamuro et al. "IGBT History, State-of-the-Art, and Future Prospects", IEEE Transactions on Electron Devices, Mar. 2017, vol. 64, No. 3, pp. 741-752.

Hiromichi Gohara et al., "Ultra-compact and light weight intelligent power semiconductor module for hybrid system", 2013 World Electric Vehicle Symposium and Exhibition (EVS27), Nov. 17-20, 2013, pp. 1-6.

Simon Lineykin et al., "Modeling and Analysis of Thermoelectric Modules", Twentieth Annual IEEE Applied Power Electronics Conference and Exposition, 2005, pp. 2019-2023.

Naoki Mitamura et al., "The new 7th generation IGBT module with high compactness and high power density", IECON 2015—41st Annual Conference of the IEEE Industrial Electronics Society, Nov. 9-12, 2015, pp. 000905-000908.

K. Takahashi et al., "New reverse-conducting IGBT (1200V) with revolutionary compact package", The 2014 International Power Electronics Conference (IPEC-Hiroshima 2014—ECCE Asia), 2014, pp. 2569-2574.

Yimin Zhao et al., "Silver sintering die attach process for IGBT power module production", 2017 IEEE Applied Power Electronics Conference and Exposition (APEC), 2017, pp. 3091-3094.

B. J. Baliga, "Analytical Modeling of IGBTs: Challenges and Solutions", IEEE Transactions on Electron Devices, Feb. 2013, vol. 60, No. 2, pp. 535-543.

Tomoyuki Hatakeyama et al., "Electro-Thermal Analysis and Monte Carlo Simulation for Thermal Design of Si Devices", Transaction of The Japan Institute of Electronics Packaging, 2011, vol. 4, No. 1, pp. 61?67.

Gerhard K. Wachutka, "Rigorous thermodynamic treatment of heat generation and conduction in semiconductor device modeling", IEEE Transactions on Computer-Aided Design of Integrated Circuits and Systems, Nov. 1990, vol. 9, No. 11, pp. 1141-1149.

Zhou Bin et al., "Internal thermal resistance test and analysis of power device based on structure function", 2013 14th International Conference on Electronic Packaging Technology, 2013, pp. 1082-1085.

Simon Lineykin et al., "Modeling and Analysis of Thermoelectric Modules", in IEEE Transactions on Industry Applications, vol. 43, No. 2, Mar.-Apr. 2007, pp. 505-512.

International Search Report and Written Opinion (ISA/237) of the International Search Authority for International Patent Application No. PCT/JP2022/007182, mailed by the Japan Patent Office on Apr. 5, 2022.

Office Action issued for counterpart Chinese Application 202280006753.6, issued by The State Intellectual Property Office of People's Republic of China on Feb. 7, 2026.

* cited by examiner

SEMICONDUCTOR DEVICE AND SEMICONDUCTOR MODULE

The contents of the following Japanese patent application(s) are incorporated herein by reference:

NO. 2021-068348 filed in JP on Apr. 14, 2021

NO. PCT/JP2022/007182 filed in WO on Feb. 22, 2022

BACKGROUND

1. Technical Field

The present invention relates to a semiconductor device and a semiconductor module.

2. Related Art

Conventionally, a semiconductor device including a transistor portion and a diode portion is known (see, for example, Patent Documents 1 and 2).

Patent Document 1: WO 2018/225571

Patent Document 2: Japanese Patent Application Publication No. 2008-053648

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are essential to the solution of the invention.

In the present specification, one side of a semiconductor device 100 in a thickness direction is referred to as “upper”, and the other side is referred to as “lower”. Out of two principal surfaces of an element, a substrate, a layer, a film, or other members, one principal surface is referred to as an upper surface, and the other principal surface is referred to as a lower surface. The “upper” and “lower” directions are not limited to the gravitational direction. In the present example, the up-down direction is referred to as a Z axis direction, and two directions orthogonal to each other in a plane perpendicular to the Z axis direction are respectively referred to as an X axis direction and a Y axis direction. The XYZ axes constitute a right-handed system. A top view refers to a case where the semiconductor device 100 is seen from a Z axis positive direction.

In each embodiment example, an example in which a first conductivity type is an N type and a second conductivity type is a P type is described, but the first conductivity type may be the P type and the second conductivity type may be the N type. In this case, conductivity types of substrates, layers, regions, and the like in each embodiment example are of opposite polarities, respectively. Each of the layers and regions noted with N or P means that electrons or holes are majority carriers. In addition, the signs + and − affixed to N and P respectively mean that the layers or regions have higher doping concentrations and lower doping concentrations than the layers or regions without + and −.

Figure 1A:
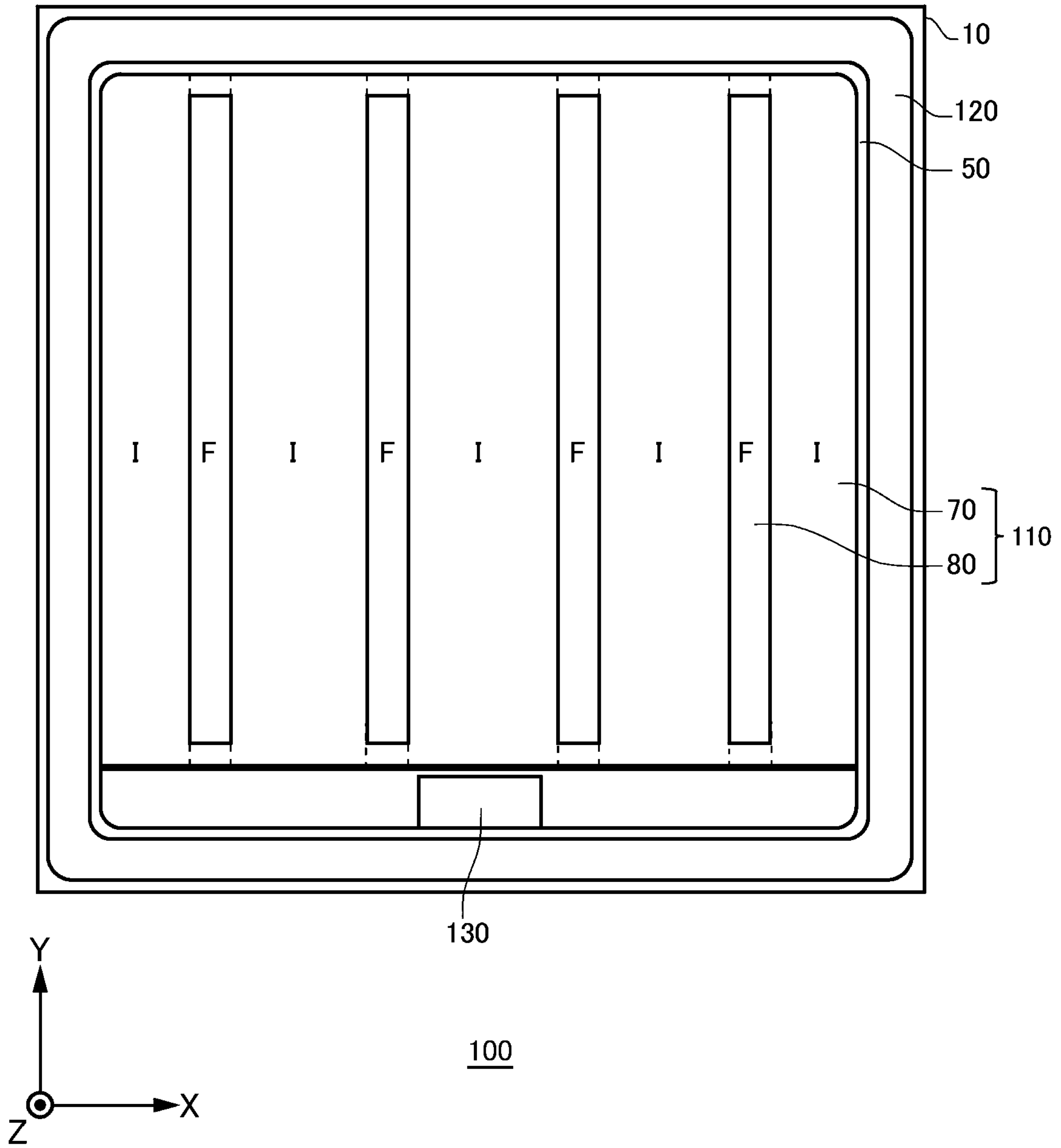
FIG. 1A shows an example of a top view of a semiconductor device 100 according to an embodiment example 1.

FIG. 1A shows an example of a top view of the semiconductor device 100 according to an embodiment example 1. The semiconductor device 100 is a semiconductor chip including a transistor portion 70 and a diode portion 80.

The transistor portion 70 includes a transistor such as an IGBT (Insulated Gate Bipolar Transistor). The diode portion 80 includes a diode such as a free wheel diode (FWD). The semiconductor device 100 of the present example is a reverse conducting IGBT (RC-IGBT) having the transistor portion 70 and the diode portion 80 on the same chip.

The semiconductor substrate 10 may be a silicon substrate, a silicon carbide substrate, or a nitride semiconductor substrate or the like formed of gallium nitride or the like. The semiconductor substrate 10 of the present example is a silicon substrate. The semiconductor substrate 10 includes an active region 110 and an outer peripheral region 120.

The transistor portion 70 is a region obtained by projecting a collector region provided on a lower surface side of the semiconductor substrate 10 onto an upper surface of the semiconductor substrate 10. The collector region is of the second conductivity type. As an example, the collector region is of the P+ type.

The diode portion 80 is a region obtained by projecting a cathode region provided on the lower surface side of the semiconductor substrate 10 onto the upper surface of the semiconductor substrate 10. The cathode region is of the first conductivity type. As an example, the cathode region of the present example is of the N+ type.

The transistor portion 70 and the diode portion 80 may be arrayed alternately and periodically within the XY plane. The transistor portion 70 and the diode portion 80 of the present example include a plurality of transistor portions and diode portions. In regions among the transistor portions 70 and the diode portions 80, a gate metal layer 50 may be provided above the semiconductor substrate 10.

It is to be noted that the transistor portion 70 and the diode portion 80 of the present example each include a trench portion extending in the Y axis direction. Alternatively, the transistor portion 70 and the diode portion 80 may each include a trench portion extending in the X axis direction.

The active region 110 includes the transistor portion 70 and the diode portion 80. The active region 110 is a region where a principal current flows between the upper surface and lower surface of the semiconductor substrate 10 when the semiconductor device 100 is controlled to be in an ON state. In other words, the active region is a region where a current flows inside the semiconductor substrate 10 in a depth direction from the upper surface to the lower surface or from the lower surface to the upper surface of the semiconductor substrate 10. In the present specification, each of the transistor portion 70 and the diode portion 80 will be referred to as a device portion or a device region.

It is to be noted that in a top view, a region sandwiched between two device portions is also the active region 110. In the present example, a region that is sandwiched between the device portions and where the gate metal layer 50 is provided is also included in the active region 110.

The gate metal layer 50 is formed of a material including metal. For example, the gate metal layer 50 is formed of aluminum, an aluminum-silicon alloy, or an aluminum-silicon-copper alloy. The gate metal layer 50 is electrically connected to a gate conductive portion of the transistor portion 70, and supplies a gate voltage to the transistor portion 70. The gate metal layer 50 is provided so as to surround an outer periphery of the active region 110 in the top view. The gate metal layer 50 is electrically connected to a gate pad 130 provided in the outer peripheral region 120. The gate metal layer 50 may be provided along an outer peripheral edge of the semiconductor substrate 10. Further, the gate metal layer 50 may be provided between the transistor portion 70 and the diode portion 80 in the top view.

In the top view, the outer peripheral region 120 is a region between the active region 110 and the outer peripheral edge of the semiconductor substrate 10. In the top view, the outer peripheral region 120 is provided so as to surround the active region 110. One or more metal pads for connecting the semiconductor device 100 and an external device by a wire or the like may be arranged in the outer peripheral region 120. It is to be noted that the outer peripheral region 120 may include an edge termination structure portion. The edge termination structure portion relaxes an electric field strength on the upper surface side of the semiconductor substrate 10. The edge termination structure portion includes, for example, a guard ring, a field plate, or a RESURF, and a combined structure thereof.

The gate pad 130 is electrically connected to the gate conductive portion of the transistor portion 70 via the gate metal layer 50. The gate pad 130 is set at a gate potential. The gate pad 130 of the present example has a rectangular shape in the top view.

Figure 1B:
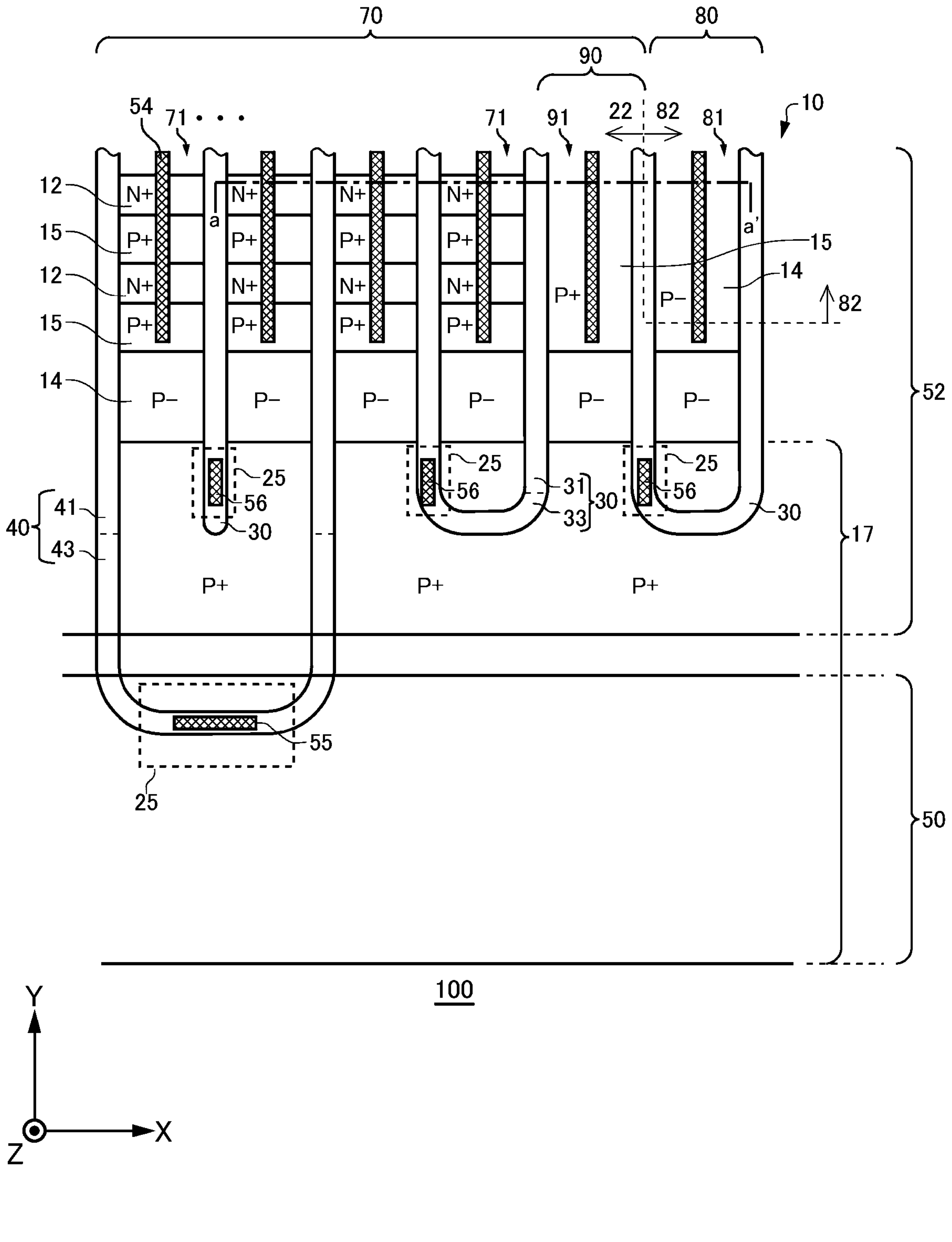
FIG. 1B shows an example of the top view of the semiconductor device 100.

FIG. 1B shows an example of the top view of the semiconductor device 100. In the present example, an enlarged diagram of an end portion of the active region 110 is shown.

The transistor portion 70 is a region obtained by projecting a collector region 22 provided on the back surface side of the semiconductor substrate 10 onto the upper surface of the semiconductor substrate 10. The collector region 22 is of the second conductivity type. As an example, the collector region 22 of the present example is of the P+ type. The transistor portion 70 includes a boundary portion 90 that is positioned at a boundary between the transistor portion 70 and the diode portion 80.

The diode portion 80 is a region obtained by projecting a cathode region 82 provided on the back surface side of the semiconductor substrate 10 onto the upper surface of the semiconductor substrate 10. The cathode region 82 is of the first conductivity type. As an example, the cathode region 82 of the present example is of the N+ type.

The semiconductor device 100 of the present example includes a gate trench portion 40, a dummy trench portion 30, an emitter region 12, a base region 14, a contact region 15, and a well region 17 on the front surface of the semiconductor substrate 10. In addition, the semiconductor device 100 of the present example includes an emitter electrode 52 and a gate metal layer 50 provided above the front surface of the semiconductor substrate 10.

The emitter electrode 52 is provided above the gate trench portion 40, the dummy trench portion 30, the emitter region 12, the base region 14, the contact region 15, and the well region 17. In addition, the gate metal layer 50 is provided above the gate trench portion 40 and the well region 17. The emitter electrode 52 of the present example is set at an emitter potential of the transistor portion 70. The emitter electrode 52 is an example of a front surface electrode which is provided above the semiconductor substrate 10 and is electrically connected to the transistor portion 70 and the diode portion 80.

The emitter electrode 52 and the gate metal layer 50 are formed of a material including metal. For example, at least a partial region of the emitter electrode 52 may be formed of aluminum, an aluminum-silicon alloy, or an aluminum-silicon-copper alloy. The emitter electrode 52 may include barrier metal formed of titanium, a titanium compound, or the like under the region formed of aluminum or the like. The emitter electrode 52 and the gate metal layer 50 are provided separately from each other.

The emitter electrode 52 and the gate metal layer 50 are provided above the semiconductor substrate 10 with an interlayer dielectric film 38 interposed therebetween. The interlayer dielectric film 38 is omitted in FIG. 1B. A contact hole 54, a contact hole 55, and a contact hole 56 are provided so as to penetrate through the interlayer dielectric film 38.

The contact hole 55 connects the gate metal layer 50 and the gate conductive portion inside the transistor portion 70. Inside the contact hole 55, a plug formed of tungsten or the like may be formed.

The contact hole 56 connects the emitter electrode 52 and the dummy conductive portion in the dummy trench portion 30. Inside the contact hole 56, a plug formed of tungsten or the like may be formed.

A connection portion 25 electrically connects the emitter electrode 52, the gate metal layer 50, or the like with the semiconductor substrate 10. In one example, the connection portion 25 is provided between the gate metal layer 50 and the gate conductive portion. The connection portion 25 is also provided between the emitter electrode 52 and the dummy conductive portion. The connection portion 25 is formed of a conductive material such as polysilicon doped with impurities. Herein, the connection portion 25 is formed of polysilicon doped with N type impurities (N+). The connection portion 25 is provided above the front surface of the semiconductor substrate 10 via a dielectric film such as an oxide film, or the like.

The gate trench portions 40 are arrayed at predetermined intervals along a predetermined array direction (the X axis direction in the present example). The gate trench portion 40 of the present example may include two extending portions 41 extending along an extending direction (the Y axis direction in the present example) that is parallel to the front surface of the semiconductor substrate 10 and is perpendicular to the array direction, and a connecting portion 43 connecting the two extending portions 41.

At least a part of the connecting portion 43 is preferably formed in a curved shape. By connecting end portions of the two extending portions 41 of the gate trench portion 40, the electric field strength at the end portions of the extending portions 41 can be relaxed. At the connecting portion 43 of the gate trench portion 40, the gate metal layer 50 may be connected to the gate conductive portion.

The dummy trench portion 30 is a trench portion electrically connected to the emitter electrode 52. Similar to the gate trench portions 40, the dummy trench portions 30 are arrayed at predetermined intervals along a predetermined array direction (the X axis direction in the present example). Similar to the gate trench portion 40, the dummy trench portion 30 of the present example may have a U shape on the front surface of the semiconductor substrate 10. That is, the dummy trench portion 30 may include two extending portions 31 extending along the extending direction and a connecting portion 33 connecting the two extending portions 31.

The transistor portion 70 of the present example has a structure in which two gate trench portions 40 and three dummy trench portions 30 are arrayed repetitively. That is, the transistor portion 70 of the present example includes the gate trench portions 40 and the dummy trench portions 30 at a ratio of 2:3. For example, the transistor portion 70 includes one extending portion 31 between two extending portions 41. In addition, the transistor portion 70 includes two extending portions 31 adjacent to the gate trench portion 40.

It is to be noted that the ratio between the gate trench portions 40 and the dummy trench portions 30 is not limited to the present example. The ratio between the gate trench portions 40 and the dummy trench portions 30 may be 1:1 or may be 2:4. Alternatively, all trench portions may be the gate trench portions 40 without providing the dummy trench portion 30 in the transistor portion 70.

The well region 17 is a region of the second conductivity type, which is provided closer to the front surface of the semiconductor substrate 10 than the drift region 18 to be described later. The well region 17 is an example of a well region provided on an edge side of the semiconductor device 100. As an example, the well region 17 is of the P+ type. The well region 17 is formed within a predetermined range from the end portion of the active region on a side on which the gate metal layer 50 is provided. The well region 17 may have a diffusion depth larger than a depth of the gate trench portion 40 and the dummy trench portion 30. Partial regions of the gate trench portion 40 and the dummy trench portion 30 on the gate metal layer 50 side are formed in the well region 17. The bottoms of ends of the gate trench portion 40 and the dummy trench portion 30 in the extending direction may be covered by the well region 17.

The contact hole 54 is formed above each region of the emitter region 12 and the contact region 15 in the transistor portion 70. Further, the contact hole 54 is provided above the base region 14 in the diode portion 80. The contact hole 54 is provided above the contact region 15 in the boundary portion 90. The contact hole 54 is provided above the base region 14 in the diode portion 80. No contact holes 54 are provided above the well region 17 provided at both ends in the Y axis direction. In this manner, one or more contact holes 54 are formed in the interlayer dielectric film. The one or more contact holes 54 may be provided so as to extend in the extending direction.

The boundary portion 90 is a region that is provided in the transistor portion 70 and is in direct contact with the diode portion 80. The boundary portion 90 includes the contact region 15. The boundary portion 90 of the present example does not include the emitter region 12. In one example, the trench portions in the boundary portion 90 are the dummy trench portions 30. The boundary portion 90 of the present example is arranged such that both ends thereof in the X axis direction become the dummy trench portions 30.

A mesa portion 71, a mesa portion 91, and a mesa portion 81 are mesa portions provided in direct contact with the trench portions in a plane parallel to the front surface of the semiconductor substrate 10. The mesa portion is a portion of the semiconductor substrate 10 sandwiched between two trench portions adjacent to each other, and may be a portion ranging from the front surface of the semiconductor substrate 10 to a depth of a lowermost bottom portion of each trench portion. The extending portions of each trench portion may be set to be one trench portion. That is, the region sandwiched between two extending portions may be set to be a mesa portion.

The mesa portion 71 is provided in direct contact with at least one of the dummy trench portion 30 or the gate trench portion 40 in the transistor portion 70. The mesa portion 71 includes the well region 17, the emitter region 12, the base region 14, and the contact region 15 on the front surface of the semiconductor substrate 10. In the mesa portion 71, the emitter region 12 and the contact region 15 are provided alternately in the extending direction.

The mesa portion 91 is provided at the boundary portion 90. The mesa portion 91 includes the contact region 15 and the well region 17 on the front surface of the semiconductor substrate 10.

The mesa portion 81 is provided in a region sandwiched between the dummy trench portions 30 adjacent to each other in the diode portion 80. The mesa portion 81 includes the base region 14, the contact region 15, and the well region 17 on the front surface of the semiconductor substrate 10.

The base region 14 is a region of the second conductivity type, which is provided on the front surface side of the semiconductor substrate 10 in the transistor portion 70 and the diode portion 80. As an example, the base region 14 is of the P− type. The base region 14 may be provided at both end portions of the mesa portion 71 and the mesa portion 91 in the Y axis direction on the front surface of the semiconductor substrate 10. It is to be noted that FIG. 1B shows only one end portion of the base region 14 in the Y axis direction.

The emitter region 12 is a region of the first conductivity type, which has a higher doping concentration than the drift region 18. As an example, the emitter region 12 of the present example is of the N+ type. An example of a dopant of the emitter region 12 is arsenic (As). The emitter region 12 is provided in contact with the gate trench portion 40 on the front surface of the mesa portion 71. The emitter region 12 may be provided so as to extend from one of the two trench portions sandwiching the mesa portion 71 to the other trench portion in the X axis direction. The emitter region 12 is also provided below the contact hole 54.

In addition, the emitter region 12 may or may not be in contact with the dummy trench portion 30. The emitter region 12 of the present example is in contact with the dummy trench portion 30. The emitter region 12 does not need to be provided in the mesa portion 91 of the boundary portion 90.

The contact region 15 is a region of the second conductivity type, which has a higher doping concentration than the base region 14. As an example, the contact region 15 of the present example is of the P+ type. The contact region 15 of the present example is provided on the front surface of the mesa portion 71 and the mesa portion 91. The contact region 15 may be provided so as to extend from one of the two trench portions sandwiching the mesa portion 71 or the mesa portion 91 to the other trench portion in the X axis direction. The contact region 15 may or may not be in contact with the gate trench portion 40. Moreover, the contact region 15 may or may not be in contact with the dummy trench portion 30. In the present example, the contact region 15 is in contact with the dummy trench portion 30 and the gate trench portion 40. The contact region 15 is also provided below the contact hole 54. It is to be noted that the contact region 15 may also be provided in the mesa portion 81.

Figure 1C:
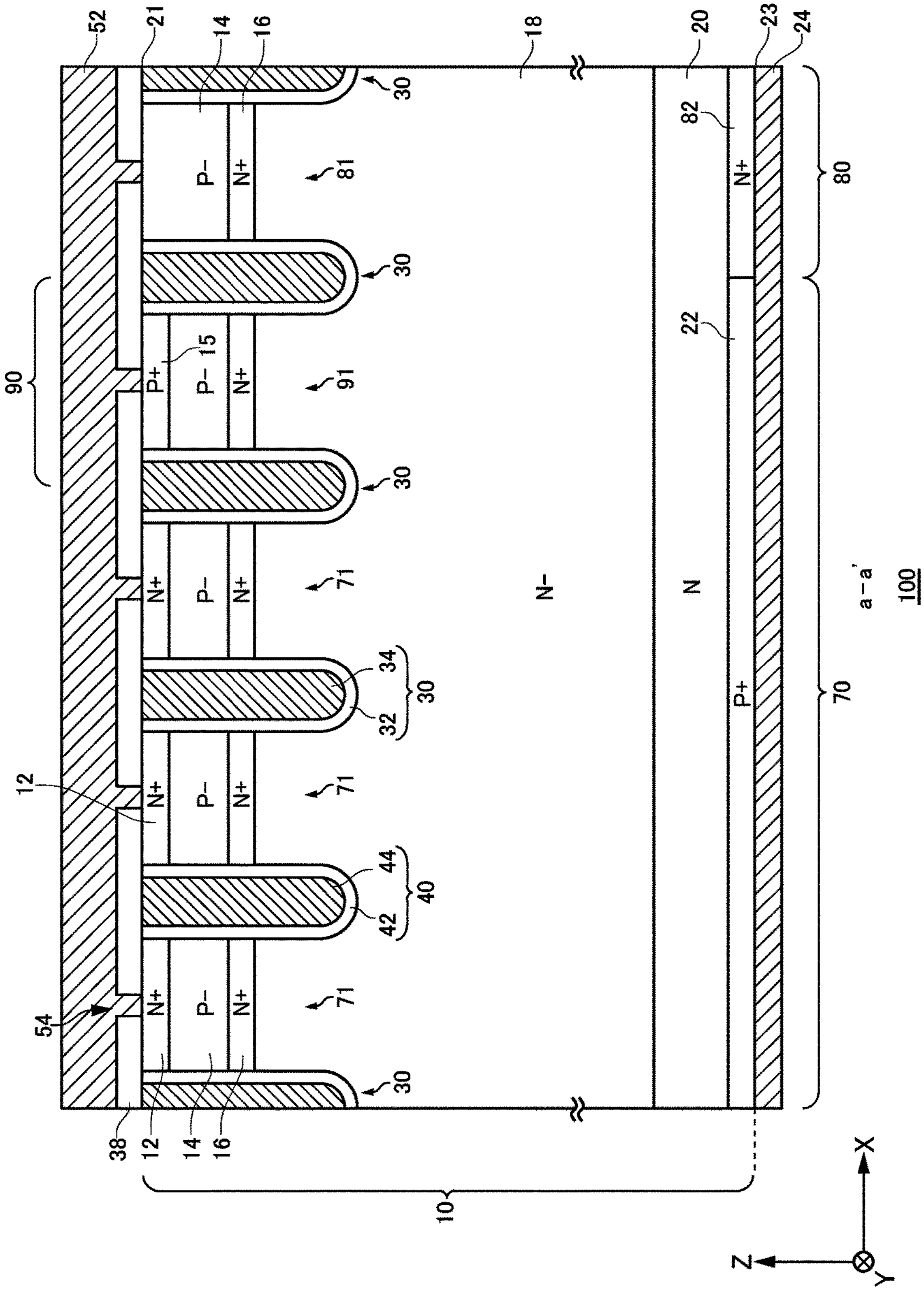
FIG. 1C is a diagram showing an example of a cross section a-a' in FIG. 1B.

FIG. 1C is a diagram showing an example of a cross section a-a' in FIG. 1B. The cross section a-a' is an XZ plane that passes through the emitter regions 12 in the transistor portion 70. In the cross section a-a', the semiconductor device 100 of the present example includes the semiconductor substrate 10, the interlayer dielectric film 38, the emitter electrode 52, and the collector electrode 24. The emitter electrode 52 is formed above the semiconductor substrate 10 and the interlayer dielectric film 38.

The drift region 18 is a region of the first conductivity type, which is provided in the semiconductor substrate 10. As an example, the drift region 18 of the present example is of the N− type. The drift region 18 may be a region that has remained without other doping regions being formed in the semiconductor substrate 10. That is, the doping concentration of the drift region 18 may be a doping concentration of the semiconductor substrate 10.

The buffer region 20 is a region of the first conductivity type, which is provided below the drift region 18. As an example, the buffer region 20 of the present example is of the N type. The doping concentration of the buffer region 20 is higher than the doping concentration of the drift region 18. The buffer region 20 may function as a field stop layer which prevents a depletion layer extending from the lower surface side of the base regions 14 from reaching the collector region 22 of the second conductivity type and the cathode region 82 of the first conductivity type.

The collector region 22 is provided below the buffer region 20 in the transistor portion 70. The cathode region 82 is provided below the buffer region 20 in the diode portion 80. A boundary between the collector region 22 and the cathode region 82 is a boundary between the transistor portion 70 and the diode portion 80.

The collector electrode 24 is formed on the back surface 23 of the semiconductor substrate 10. The collector electrode 24 is formed of a conductive material such as metal.

The base region 14 is a region of the second conductivity type, which is provided above the drift region 18 in the mesa portion 71, the mesa portion 91, and the mesa portion 81. The base region 14 is provided in contact with the gate trench portion 40. The base region 14 may be provided in contact with the dummy trench portion 30.

The emitter region 12 is provided between the base region 14 and the front surface 21 in the mesa portion 71. The emitter region 12 is provided in contact with the gate trench portion 40. The emitter region 12 may or may not be in contact with the dummy trench portion 30. It is to be noted that the emitter region 12 does not need to be provided in the mesa portion 91.

The contact region 15 is provided above the base region 14 in the mesa portion 91. The contact region 15 is provided in contact with the dummy trench portion 30 in the mesa portion 91. In another cross section, the contact region 15 may be provided on the front surface 21 of the mesa portion 71.

An accumulation region 16 is a region of the first conductivity type, which is provided closer to the front surface 21 of the semiconductor substrate 10 than the drift region 18. As an example, the accumulation region 16 of the present example is of the N+ type. The accumulation region 16 is provided in the transistor portion 70 and the diode portion 80. The accumulation region 16 of the present example is also provided in the boundary portion 90. This allows the semiconductor device 100 to avoid mask misalignment in the accumulation region 16.

In addition, the accumulation region 16 is provided in contact with the gate trench portion 40. The accumulation region 16 may or may not be in contact with the dummy trench portion 30. The doping concentration of the accumulation region 16 is higher than the doping concentration of the drift region 18. By providing the accumulation region 16, a carrier injection enhancement effect (IE effect) can be enhanced to reduce an ON voltage of the transistor portion 70.

One or more gate trench portions 40 and one or more dummy trench portions 30 are provided on the front surface 21. Each trench portion is provided from the front surface 21 to the drift region 18. In the region where at least any of the emitter region 12, the base region 14, the contact region 15, and the accumulation region 16 is provided, each trench portion also penetrates through these regions to reach the drift region 18. The configuration of the trench portion penetrating through the doping region is not limited to the one manufactured in the order of forming the doping region and then forming the trench portion. The configuration of the trench portion penetrating through the doping region also includes a configuration of the doping region being formed between the trench portions after forming the trench portions.

The gate trench portion 40 includes a gate trench, a gate dielectric film 42, and a gate conductive portion 44 that are formed on the front surface 21. The gate dielectric film 42 is formed to cover an inner wall of the gate trench. The gate dielectric film 42 may be formed by oxidizing or nitriding a semiconductor on the inner wall of the gate trench. The gate conductive portion 44 is formed on an inner side of the gate dielectric film 42 inside the gate trench. The gate dielectric film 42 insulates the gate conductive portion 44 from the semiconductor substrate 10. The gate conductive portion 44 is formed of a conductive material such as polysilicon. The gate trench portion 40 is covered by the interlayer dielectric film 38 on the front surface 21.

The gate conductive portion 44 includes a region opposing the adjacent base region 14 on the mesa portion 71 side with the gate dielectric film 42 being interposed therebetween, in the depth direction of the semiconductor substrate 10. When a predetermined voltage is applied to the gate conductive portion 44, a channel is formed by an electron inversion layer on a surface layer of the base region 14 at a boundary in contact with the gate trench.

The dummy trench portion 30 may have the same structure as the gate trench portion 40. The dummy trench portion 30 includes a dummy trench, a dummy dielectric film 32, and a dummy conductive portion 34 that are formed on the front surface 21 side. The dummy dielectric film 32 is formed to cover the inner wall of the dummy trench. The dummy conductive portion 34 is formed inside the dummy trench and formed on an inner side of the dummy dielectric film 32. The dummy dielectric film 32 insulates the dummy conductive portion 34 from the semiconductor substrate 10. The dummy trench portion 30 is covered by the interlayer dielectric film 38 on the front surface 21.

The interlayer dielectric film 38 is provided on the front surface 21. The emitter electrode 52 is provided above the interlayer dielectric film 38. In the interlayer dielectric film 38, one or more contact holes 54 for electrically connecting the emitter electrode 52 and the semiconductor substrate 10 are provided. The contact hole 55 and the contact hole 56 may similarly be provided so as to penetrate through the interlayer dielectric film 38.

Figure 2A:
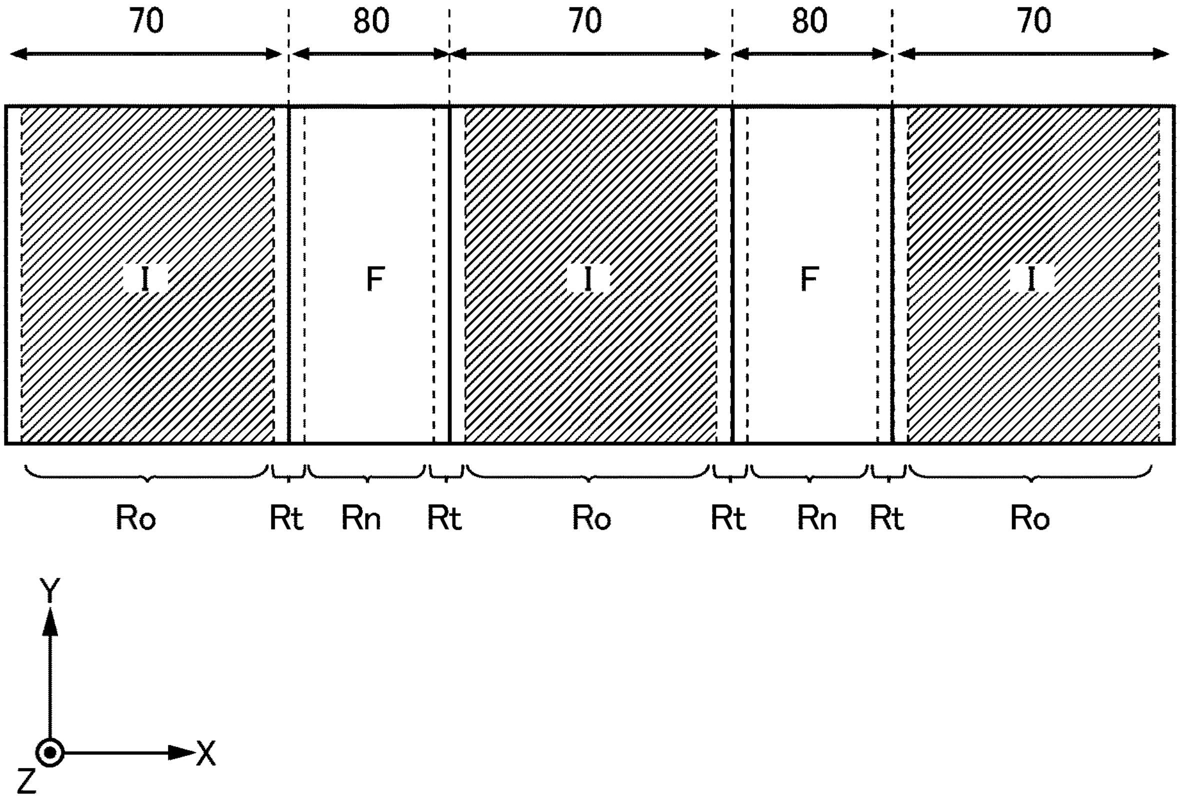
FIG. 2A shows an example of a current distribution when a transistor portion 70 is an operation region Ro.

FIG. 2A shows an example of a current distribution when the transistor portion 70 is an operation region Ro. The hatching indicates the operation regions Ro. In the present example, the transistor portion 70 functions as the operation region Ro, and the diode portion 80 functions as a non-operation region Rn. A current flows in the operation region Ro, but a current does not flow in the non-operation region Rn. A region in the vicinity of the boundary between the transistor portion 70 and the diode portion 80 functions as a transition region Rt where a part of the current that flows in the transistor portion 70 is diffused to the diode portion 80 side.

Figure 2B:
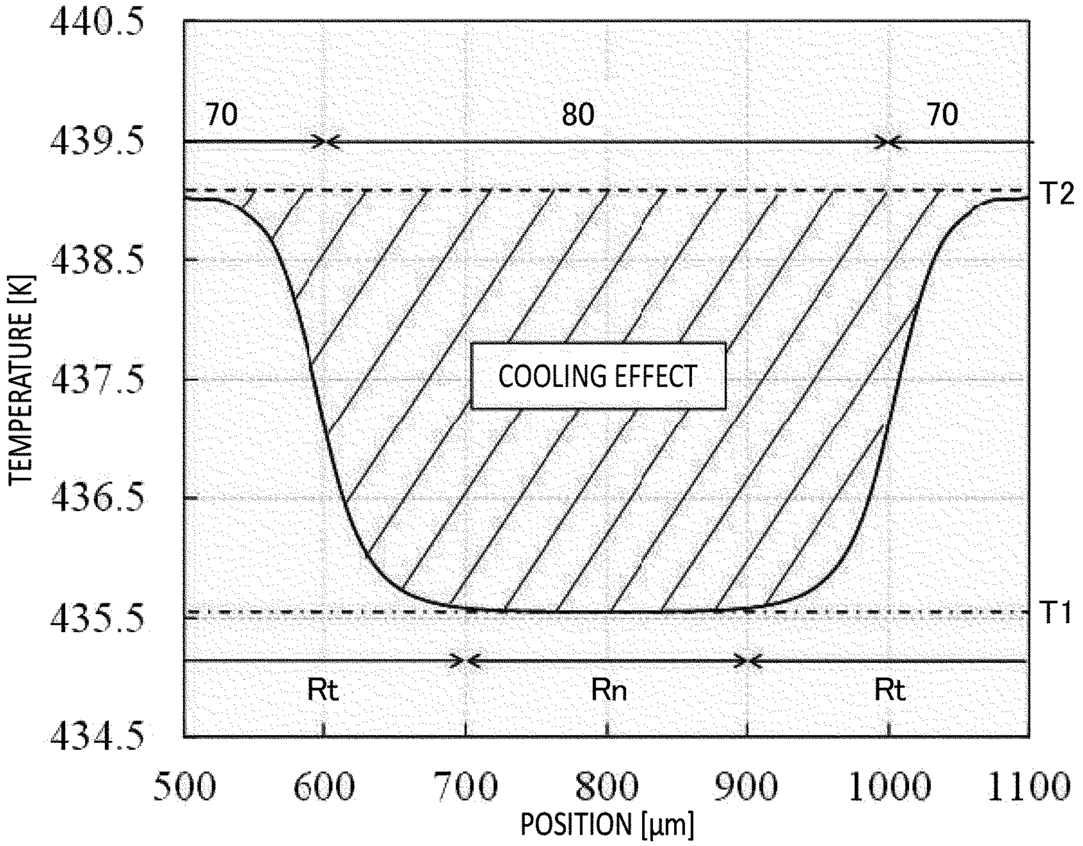
FIG. 2B shows an example of a temperature gradient of the semiconductor device 100.

FIG. 2B shows an example of a temperature gradient of the semiconductor device 100 when the transistor portion 70 is the operation region Ro. Widths of the transistor portion 70 and the diode portion 80 of the present example are 600 μm and 400 μm, respectively. The transistor portion 70 as the operation region Ro is cooled by the diode portion 80 as the non-operation region Rn. In the operation region Ro and the non-operation region Rn, a device temperature is substantially constant. A width of the transition region Rt of the present example in the array direction is approximately 200 μm.

The transition region Rt refers to a region where the temperature distribution transits from a high temperature T2 to a low temperature T1 in the vicinity of the boundary between the transistor portion 70 and the diode portion 80. For example, when the transistor portion 70 is the operation region Ro, temperature of the transistor portion 70 becomes the high temperature T2, and temperature of the diode portion 80 becomes the low temperature T1. In the transition region Rt, the temperature gradually decreases from the transistor portion 70 toward the diode portion 80. A difference between the temperature T2 and the temperature T1 represents a cooling effect by the diode portion 80.

Figure 2C:
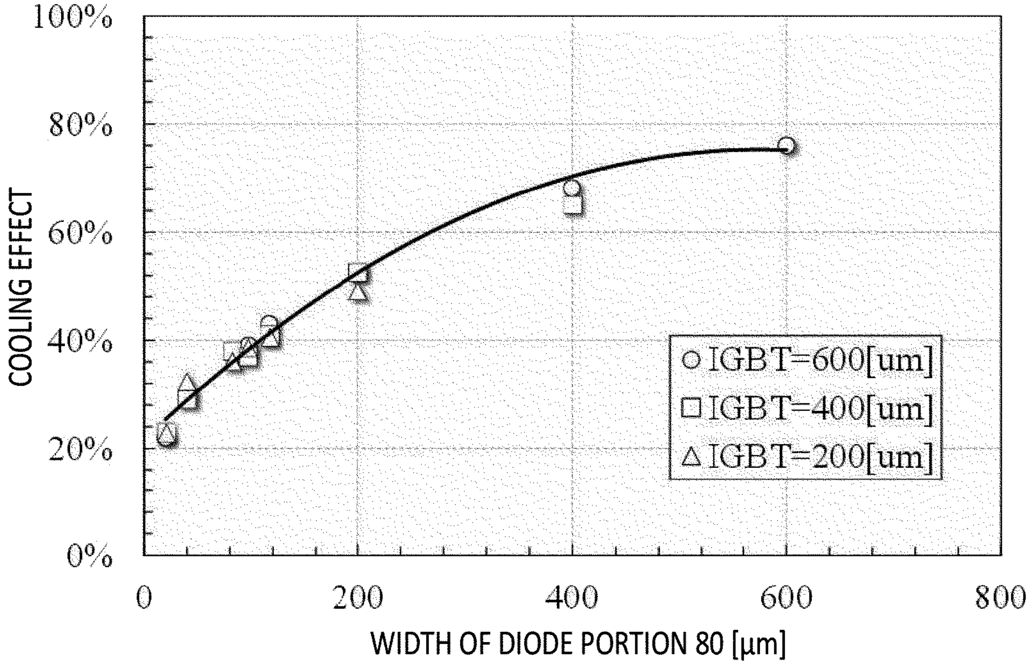
FIG. 2C shows a simulation result of a cooling effect.

FIG. 2C shows a simulation result of the cooling effect when the transistor portion 70 is the operation region Ro. In the present example, a dependency of the cooling effect on the widths of the transistor portion 70 and the diode portion 80 is shown. The longitudinal axis represents the cooling effect [%], and the horizontal axis represents the width [μm] of the diode portion 80. Circular, square, and triangular plots respectively indicate the widths of the transistor portion 70 of 600 μm, 400 μm, and 200 μm.

Herein, an increase in an active area is proportional to a product of the current and the voltage, and the cooling effect is not dependent on the width of the transistor portion 70. On the other hand, the cooling effect is improved along with the increase in the width of the diode portion 80. The improvement of the cooling effect by the diode portion 80 is more prominent in a region where the width of the diode portion 80 is smaller, and tends to gradually saturate along with the increase in the width of the diode portion 80. In this manner, the cooling effect is settled when the width of the non-operation region Rn is determined, and thus can be applied to an estimation of a chip thermal resistance as described later.

Figure 2D:
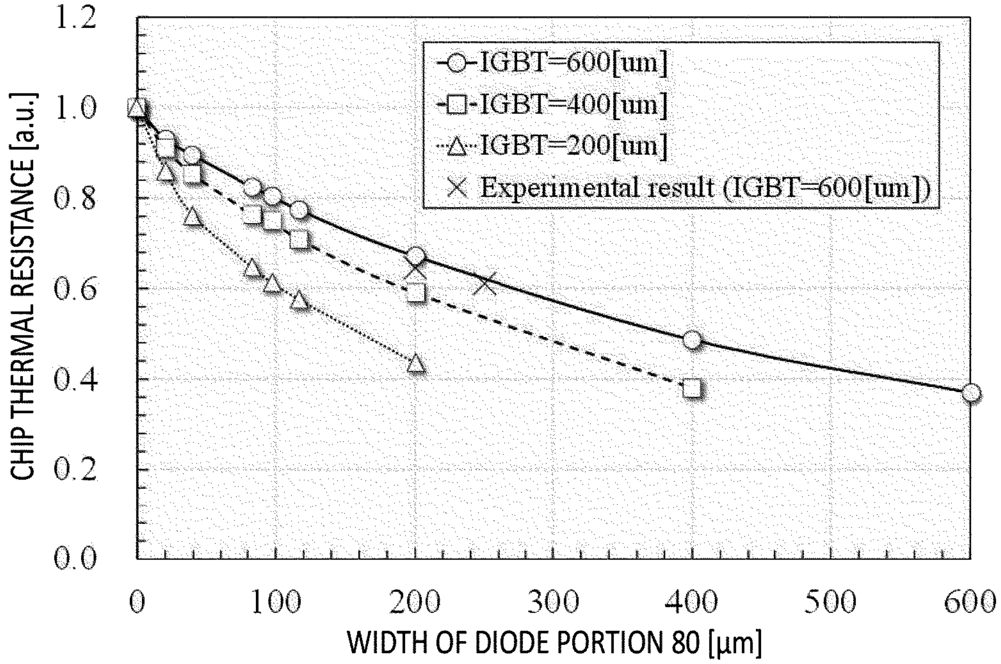
FIG. 2D shows a simulation result of a chip thermal resistance.

FIG. 2D shows a simulation result of the chip thermal resistance when the transistor portion 70 is the operation region Ro. In the present example, a dependency of the chip thermal resistance on the operation region Ro and the non-operation region Rn is shown. The longitudinal axis represents the chip thermal resistance [a.u.], and the horizontal axis represents the width [μm] of the diode portion 80. Circular, square, and triangular plots respectively indicate the widths of the transistor portion 70 of 600 μm, 400 μm, and 200 μm. X indicates an experimental result in a case where the width of the transistor portion 70 is 600 μm. It can be seen from the present figure that the chip thermal resistance decreases as the width of the diode portion 80 increases. In addition, the chip thermal resistance decreases as the width of the transistor portion 70 decreases. In the present example, it can be seen that when the IGBTs mounted on the same package structure are replaced with RC-IGBTs, a chip thermal resistance reduction effect of a maximum of about 60% can be obtained with a ratio between the IGBT and FWD being set as 1:1.

As described above, when the transistor portion 70 is the operation region Ro, the chip thermal resistance is determined by the cooling effect that is dependent on the width of the diode portion 80, and thus the chip thermal resistance at a time when the transistor portion 70 is energized can be estimated based on the width of the diode portion 80.

Figure 2E:
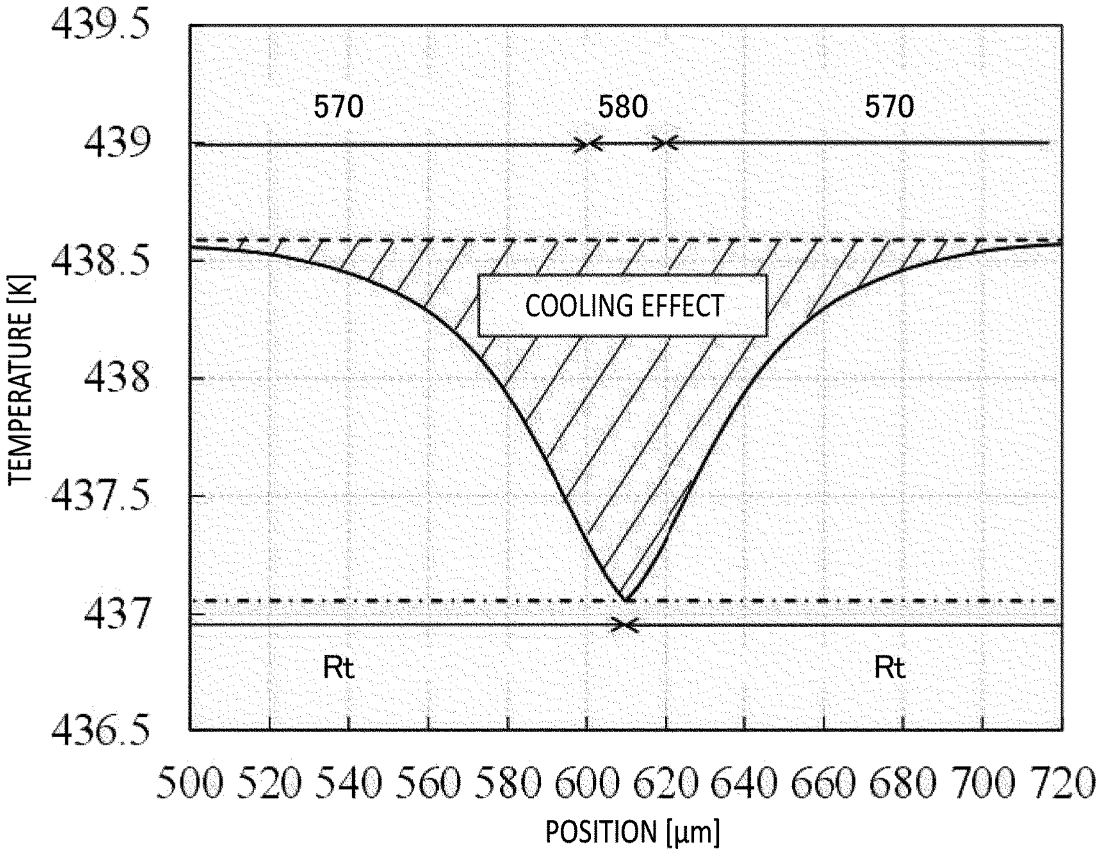
FIG. 2E shows an example of a temperature gradient of a semiconductor device according to a comparative example.

FIG. 2E shows an example of a temperature gradient of a semiconductor device according to a comparative example. The semiconductor device of the comparative example includes a transistor portion 570 and a diode portion 580. In the present example, a width of the transistor portion 570 is 600 μm, but a width of the diode portion 580 is 20 μm. Therefore, the temperature of the semiconductor device has not fully reached a minimum temperature, and thus the cooling effect is limited to the transition region Rt, and a sufficient cooling effect is not obtained.

Figure 3A:
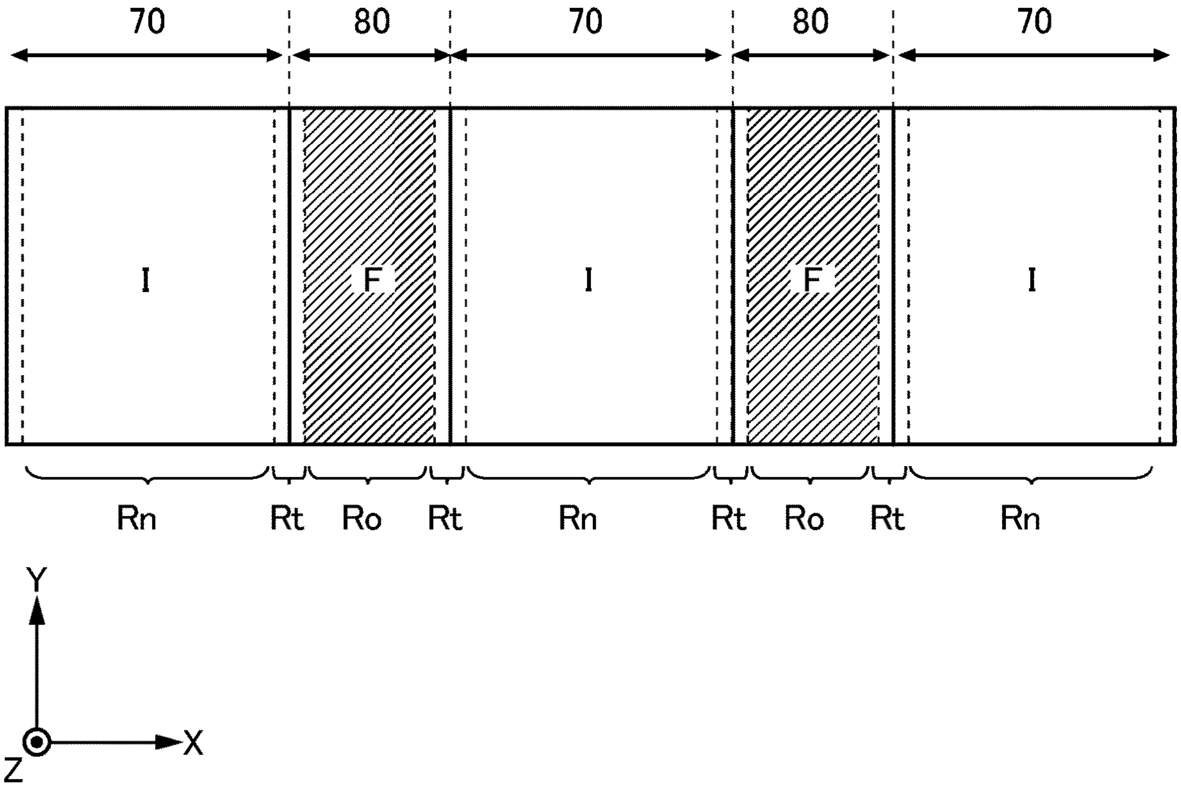
FIG. 3A shows an example of a current distribution when a diode portion 80 is the operation region Ro.

FIG. 3A shows an example of a current distribution when the diode portion 80 is the operation region Ro. The hatching indicates the operation regions Ro. In the present example, the diode portion 80 functions as the operation region Ro, and the transistor portion 70 functions as the non-operation region Rn. A region in the vicinity of the boundary between the transistor portion 70 and the diode portion 80 functions as the transition region Rt where a part of the current that flows in the diode portion 80 is diffused to the transistor portion 70 side.

Figure 3B:
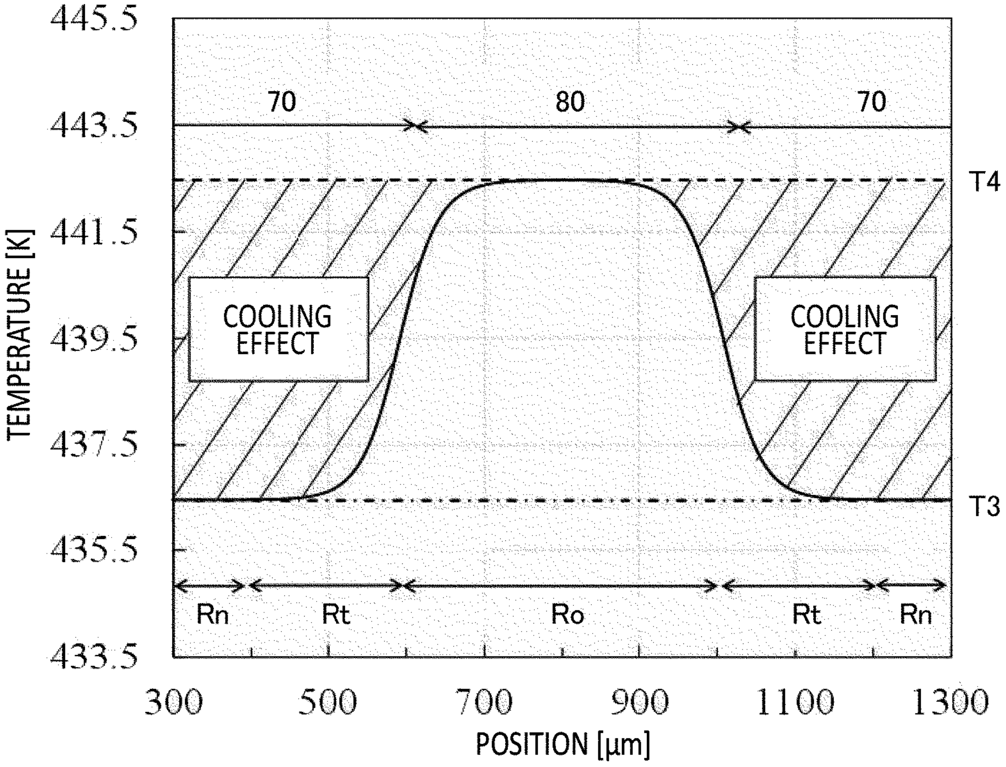
FIG. 3B shows an example of the temperature gradient of the semiconductor device 100.

FIG. 3B shows an example of a temperature gradient of the semiconductor device 100 when the diode portion 80 is the operation region Ro. The Widths of the transistor portion 70 and the diode portion 80 of the present example are 600 μm and 400 μm, respectively. The diode portion 80 as the operation region Ro is cooled by the transistor portion 70 as the non-operation region Rn. The width of the transition region Rt of the present example in the array direction is approximately 200 μm.

Comparing with FIG. 2B, since the operation region Ro is switched from the transistor portion 70 to the diode portion 80, the temperature distribution has an inverted shape. For example, when the diode portion 80 is the operation region Ro, the temperature of the diode portion 80 becomes a high temperature T4, and the temperature of the transistor portion 70 becomes a low temperature T3. In the transition region Rt, the temperature gradually decreases from the diode portion 80 toward the transistor portion 70. In the operation region Ro and the non-operation region Rn, the device temperature is substantially constant. A difference between the temperature T4 and the temperature T3 represents the cooling effect by the transistor portion 70.

Figure 3C:
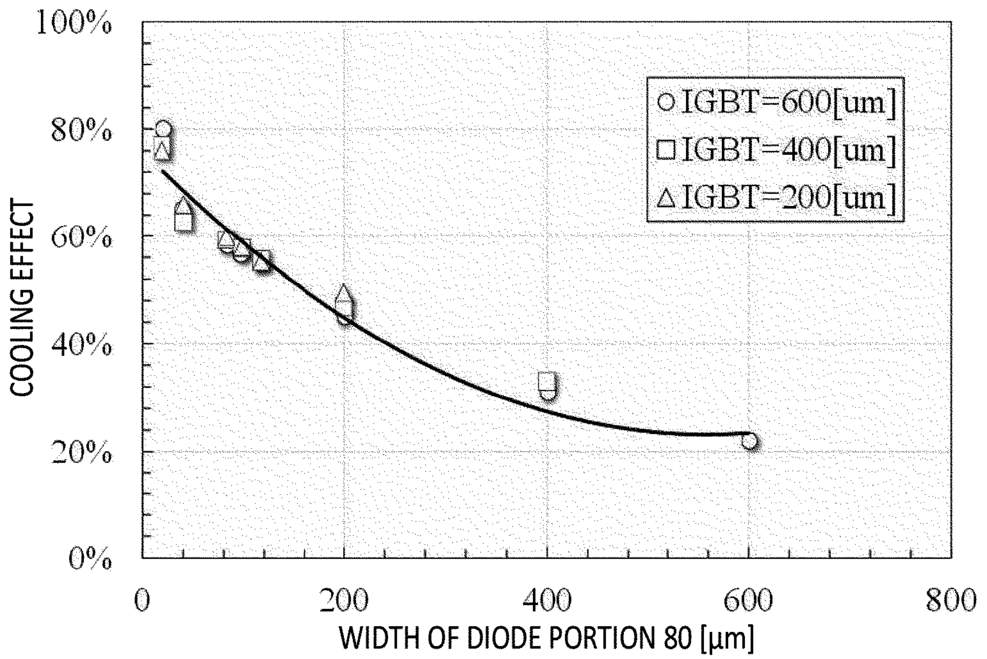
FIG. 3C shows a simulation result of the cooling effect.

FIG. 3C shows a simulation result of the cooling effect when the diode portion 80 is the operation region Ro. In the present example, a dependency of the cooling effect on the widths of the transistor portion 70 and the diode portion 80 is shown. The longitudinal axis represents the cooling effect [%], and the horizontal axis represents the width [μm] of the diode portion 80. Circular, square, and triangular plots respectively indicate the widths of the transistor portion 70 of 600 μm, 400 μm, and 200 μm. Similar to the case of FIG. 2C, the cooling effect is not dependent on the width of the transistor portion 70 and is dependent on the width of the diode portion 80. Accordingly, the cooling effect is settled when the width of the diode portion 80 is determined, and thus the width of the diode portion 80 can be applied to the estimation of the chip thermal resistance as described later.

Figure 3D:
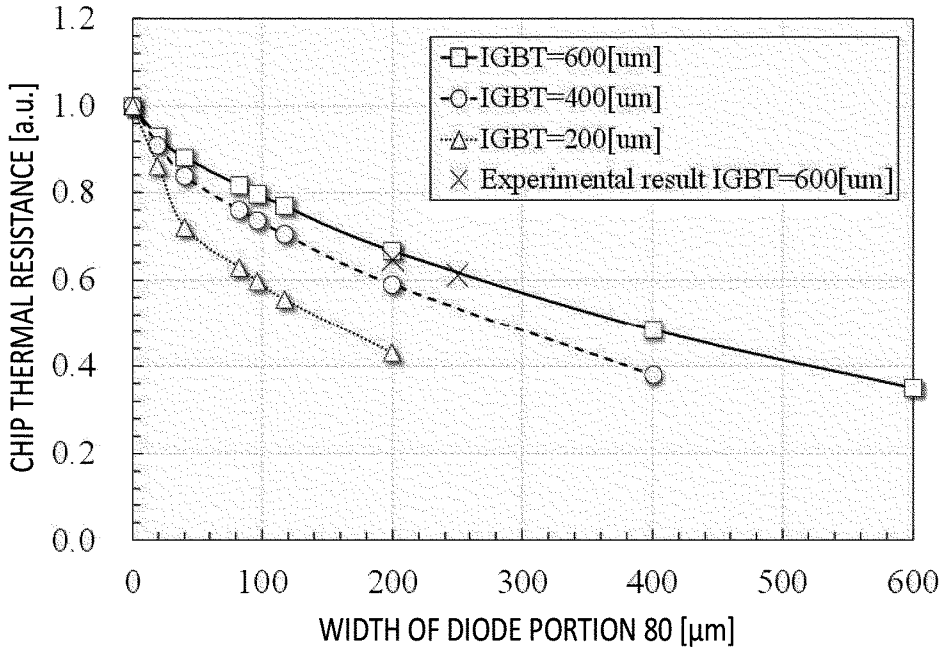
FIG. 3D shows a simulation result of the chip thermal resistance.

FIG. 3D shows a simulation result of the chip thermal resistance when the diode portion 80 is the operation region Ro. In the present example, a dependency of the chip thermal resistance on the widths of the transistor portion 70 and the diode portion 80 is shown. The longitudinal axis represents the chip thermal resistance [a.u.], and the horizontal axis represents the width [μm] of the diode portion 80. Square, circular, and triangular plots respectively indicate the widths of the transistor portion 70 of 600 μm, 400 μm, and 200 μm. X indicates an experimental result in a case where the width of the transistor portion 70 is 600 μm. It can be seen from the present figure that when the width of the transistor portion 70 and the width of the diode portion 80 are the same, the chip thermal resistance reduction effect is large. In addition, the chip thermal resistance decreases as the width of the transistor portion 70 decreases. In the present example, it can be seen that when the FWDs mounted on the same package structure are replaced with RC-IGBTs, the chip thermal resistance reduction effect of a maximum of about 60% can be obtained with the ratio between the IGBT and FWD being set as 1:1.

As described above, when the diode portion 80 is the operation region Ro, the chip thermal resistance is determined by the cooling effect that is dependent on the width of the diode portion 80, and thus the chip thermal resistance at a time when the transistor portion 70 is energized can be estimated based on the width of the diode portion 80.

Figure 3E:
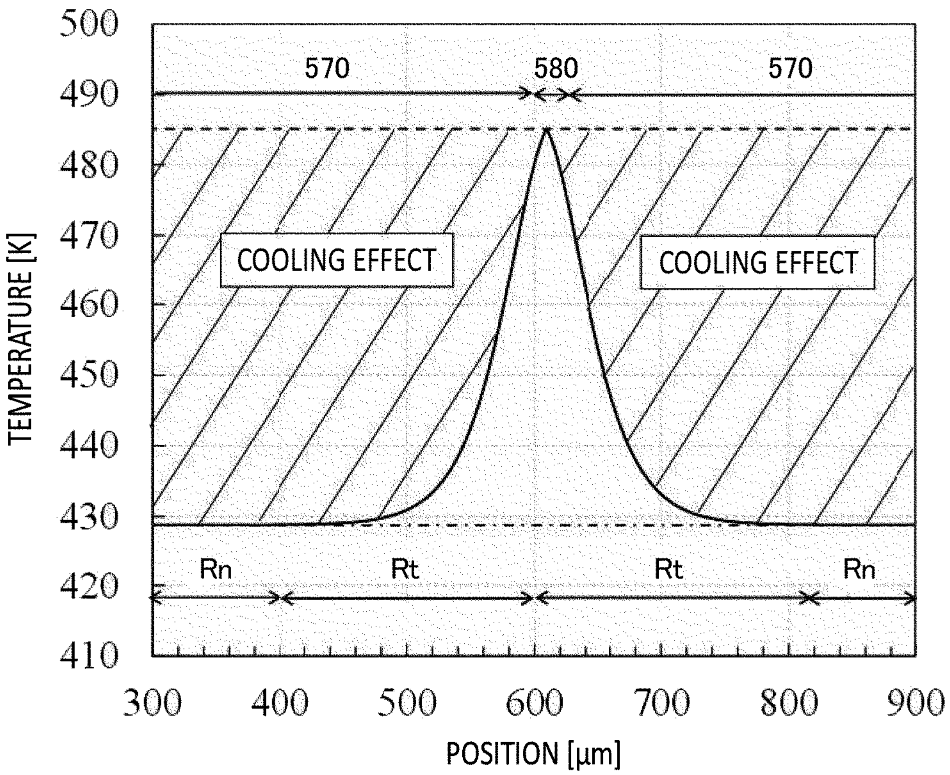
FIG. 3E shows an example of a temperature gradient of the semiconductor device according to the comparative example.

FIG. 3E shows an example of a temperature gradient of the semiconductor device according to the comparative example. The semiconductor device of the comparative example includes the transistor portion 570 and the diode portion 580. In the present example, the width of the transistor portion 570 is 600 μm, but the width of the diode portion 580 is 20 μm. In the present example, while the non-operation region Rn is sufficiently large and a larger cooling effect is obtained, the operation region Ro is small. Comparing with FIG. 2E, since the operation region Ro is switched from the transistor portion 70 to the diode portion 80, the temperature distribution has an inverted shape.

Figure 4:
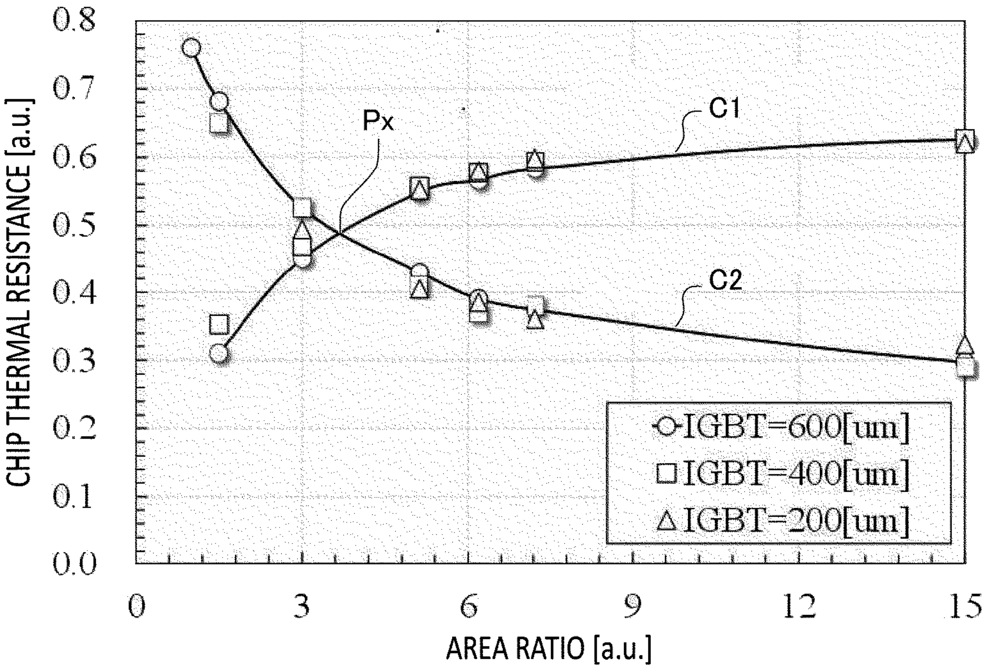
FIG. 4 shows an area ratio dependency of the chip thermal resistance.

FIG. 4 shows an area ratio dependency of the chip thermal resistance. The longitudinal axis represents the chip thermal resistance [a.u.], and the horizontal axis represents an area ratio [a.u.] of the transistor portions 70 to the diode portions 80. Circular, square, and triangular plots respectively indicate the widths of the transistor portion 70 of 600 μm, 400 μm, and 200 μm.

The curve C1 indicates a simulation result in a case where the transistor portion 70 is the operation region Ro. The curve C1 shows that, along with the increase in the area ratio, the ratio of the operation regions Ro increases, and thus the chip thermal resistance tends to increase accordingly. The curve C2 indicates a simulation result in a case where the transistor portion 70 is the non-operation region Rn. The curve C2 shows that, along with the increase in the area ratio, the ratio of the non-operation regions Rn increases, and thus the chip thermal resistance tends to decrease accordingly. In this manner, the curve C1 and the curve C2 show opposite tendencies with respect to the area ratio.

The cross point Px is a point at which the curve C1 and the curve C2 intersect. The cross point Px is a point at which the area ratio of the transistor portions 70 to the diode portions 80 becomes 3.6, and shows that the cooling effect of the semiconductor device 100 becomes maximum when the transistor portions 70 and the diode portions 80 operate.

When the area ratio is smaller than the cross point Px, the chip thermal resistances of both portions tend to largely deviate from each other. On the other hand, when the area ratio is larger than the cross point Px, the chip thermal resistances of both portions tend to saturate though deviating from each other. In this manner, the cooling effect shown in FIGS. 2B and 3B corresponds to the area of the non-operation region Rn, and while the cooling area becomes significantly smaller as the non-operation region Rn becomes smaller, the increase in the cooling area tends to saturate when the non-operation region Rn becomes long. In this manner, the area ratio dependency of the chip thermal resistance can be predicted from the cooling effect by the non-operation region Rn.

Herein, on the front surface 21 of the semiconductor substrate 10, the area ratio of the transistor portions 70 to the diode portions 80 may be set as appropriate in consideration of a relationship with the chip thermal resistance, or the like. For example, on the front surface 21 of the semiconductor substrate 10, the area ratio of the transistor portions 70 to the diode portions 80 may be larger than 2.8 and smaller than 4.7. The area ratio may be larger than 3.1 and smaller than 4.7. Moreover, within ±10% of the cross point Px, the area ratio may be larger than 3.2 and smaller than 4.0. Further, within ±5% of the cross point Px, the area ratio may be larger than 3.4 and smaller than 3.8. The area ratio may be 3.6 which is the cross point Px.

It is to be noted that on the front surface 21 of the semiconductor substrate 10, the area ratio of the transistor portions 70 to the diode portions 80 corresponds to the cycle of the transistor portions 70 and the diode portions 80 in the array direction. That is, the area ratio of the transistor portions 70 to the diode portions 80 on the front surface 21 of the semiconductor substrate 10 may be a cell pitch ratio of the width of the transistor portion 70 to the width of the diode portion 80. In other words, the cell pitch ratio may be larger than 2.8 and smaller than 4.7, may be larger than 3.1 and smaller than 4.7, may be larger than 3.2 and smaller than 4.0, may be larger than 3.4 and smaller than 3.8, or may be 3.6.

In one example, the width of the transistor portion 70 in the array direction is 100 μm or more and 800 μm or less. The width of the transistor portion 70 in the array direction may be 200 μm, may be 400 μm, or may be 600 μm.

Further, the width of the diode portion 80 in the array direction may be 10 μm or more and 700 μm or less. The width of the diode portion 80 in the array direction may be 20 μm, 40 μm, 80 μm, 100 μm, 120 μm, 200 μm, 400 μm, or 600 μm. For example, the width of the diode portion 80 sandwiched between the transistor portions 70 is 200 μm or more. The width of the diode portion 80 may be smaller than the width of the transistor portion 70.

Herein, regarding the RC-IGBT, since the chip size per chip is larger than a case where the IGBT and FWD are respectively provided on different chips in terms of the structure, the chip thermal resistance (Rth) decreases, and thus a chip thermal dissipation can be improved so as to realize a miniaturized, lightweight, and highly reliable inverter.

However, since the active region 110 is divided into the operation region Ro and the non-operation region Rn in the RC-IGBT, it is difficult to predict the chip thermal resistance. Further, since the chip thermal resistance differs between a time the IGBT is energized and a time the FWD is energized in the RC-IGBT, it is difficult to predict the chip thermal resistance. By using the method of the present example, the chip thermal resistance can be predicted from the cooling effect of the non-operation region Rn.

Figure 5A:
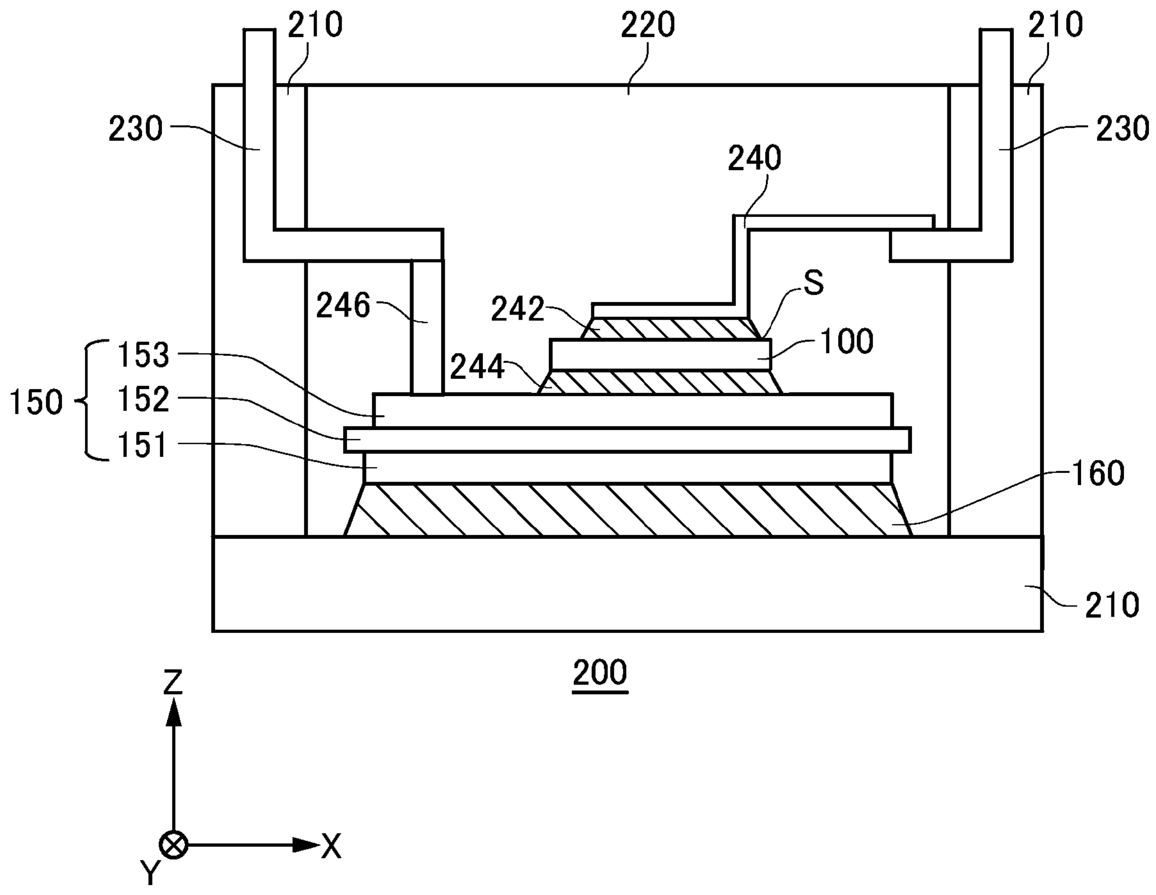
FIG. 5A shows an example of a configuration of a semiconductor module 200.

FIG. 5A shows an example of a configuration of a semiconductor module 200. The semiconductor module 200 of the present example includes the semiconductor device 100, a housing 210, an encapsulating resin 220, external connection terminals 230, and a coupling portion 240.

The housing 210 houses the semiconductor device 100. The housing 210 of the present example has a rectangular parallelepiped shape, but the present invention is not limited to this. Side walls and a bottom portion of the housing 210 may be constituted by different members. For example, the material of the housing 210 is an insulating material such as a resin. The resin may be selected from polyphenylene sulfide (PPS), polybutylene telephthalate (PBT), polybutyl acrylate (PBA), polyamide (PA), acrylonitrile butadiene styrene (ABS), liquid crystal polymer (LCP), polyether ether ketone (PEEK), polybutylene succinate (PBS), urethane, silicon, and the like.

The encapsulating resin 220 encapsulates inside of the housing 210. The encapsulating resin 220 covers the entire semiconductor device 100 and laminated substrate 150. For example, the material of the encapsulating resin 220 is an epoxy resin.

The laminated substrate 150 is provided on an upper surface of the bottom portion of the housing 210. The laminated substrate 150 includes a metal plate 151, an insulating plate 152, and a circuit portion 153. For example, the laminated substrate 150 may be a DCB (Direct Copper Bonding) substrate or an AMB (Active Metal Brazing) substrate.

The insulating plate 152 is formed of an insulating material such as ceramics including alumina ($Al_2O_3$), aluminum nitride (AlN), silicon nitride ($Si_3N_4$), and the like. The metal plate 151 is provided on a lower surface of the insulating plate 152, and may be fixed to the bottom portion of the housing 210 via a solder portion 160. A cooling member such as a heatsink may be provided at the bottom portion of the housing 210.

The circuit portion 153 is a conductive member provided on an upper surface of the insulating plate 152. The circuit portion 153 may include a metal wiring, a pad, or the like. The metal plate 151 and the circuit portion 153 may be formed by a plate containing a metal material such as copper and a copper alloy. The metal plate 151 and the circuit portion 153 may be fixed to the front surface of the insulating plate 152 by soldering, brazing, or the like. The circuit portion 153 is electrically connected to the semiconductor device 100 by the solder portion 244. In addition, the circuit portion 153 is electrically connected to the external connection terminal 230 by a coupling portion 246.

The solder portion 244 fixes the semiconductor device 100 to the circuit portion 153. The solder portion 244 electrically and mechanically connects the semiconductor device 100 and the circuit portion 153. The solder portion 244 connects the pad included in the circuit portion 153 and the collector electrode 24 of the semiconductor device 100. For example, the material of the solder portion 244 is an Sn—Cu based or Sn—Sb based solder.

The external connection terminal 230 is provided so as to be exposed to the outside of the housing 210 for electrically connecting the semiconductor device 100 and an external control device or the like. The external connection terminal 230 is provided so as to penetrate through the housing 210 and extend to the inside of the housing 210.

The coupling portion 240 electrically connects the semiconductor device 100 and the external connection terminal 230. Although the coupling portion 240 of the present example is connected to the emitter electrode 52 of the semiconductor device 100 via a junction portion 242 such as a solder, the coupling portion 240 may alternatively be directly coupled to the emitter electrode 52. The coupling portion 240 may be a conductive connection member formed by casting a metal plate by a press work or the like. The metal plate may be a plate formed of copper or a copper alloy. The coupling portion 240 may have a film plated with nickel or the like on a front surface thereof. A cross section (Z-X cross section) of the coupling portion 240 may have a rectangular portion. For example, the material of the coupling portion 240 is copper, a copper alloy, aluminum, an aluminum alloy, or the like. In one example, a thickness of the coupling portion 240 is 0.5 mm or more and 1.0 mm or less. The coupling portion 240 may be a lead frame, a ribbon, or a clip.

The coupling portion 240 of the present example is soldered to the emitter electrode 52 using the junction portion 242. Accordingly, the coupling portion 240 is fixed onto the semiconductor device 100 to thus be electrically connected to the semiconductor device 100. For example, the junction portion 242 is an Sn—Cu based or Sn—Sb based solder. It is to be noted that the coupling portion 240 may alternatively be coupled to the emitter electrode 52 by sintering.

A junction surface S is a junction surface between the junction portion 242 and the emitter electrode 52 which is the front surface electrode of the semiconductor device 100. When the junction portion 242 is omitted, the junction surface S may be a junction surface between the emitter electrode 52 and the coupling portion 240.

The coupling portion 240 of the present example is in plane contact with the front surface electrode of the semiconductor device 100. Plane contact means that the junction surface S is formed on the front surface electrode of the semiconductor device 100 to an extent that the cooling effect of the transistor portion 70 and the diode portion 80 can be realized. For example, a configuration in which the junction surface S is formed only in a small portion of the front surface electrode of the semiconductor device 100 as in wire bonding and only the junction surface S of a size not large enough to obtain the cooling effect is formed does not apply to the plane contact. Since the semiconductor module 200 of the present example includes the junction surface S joining the transistor portions 70 and the diode portions 80 at a predetermined size ratio, the cooling effect can thus be obtained.

Figure 5B:
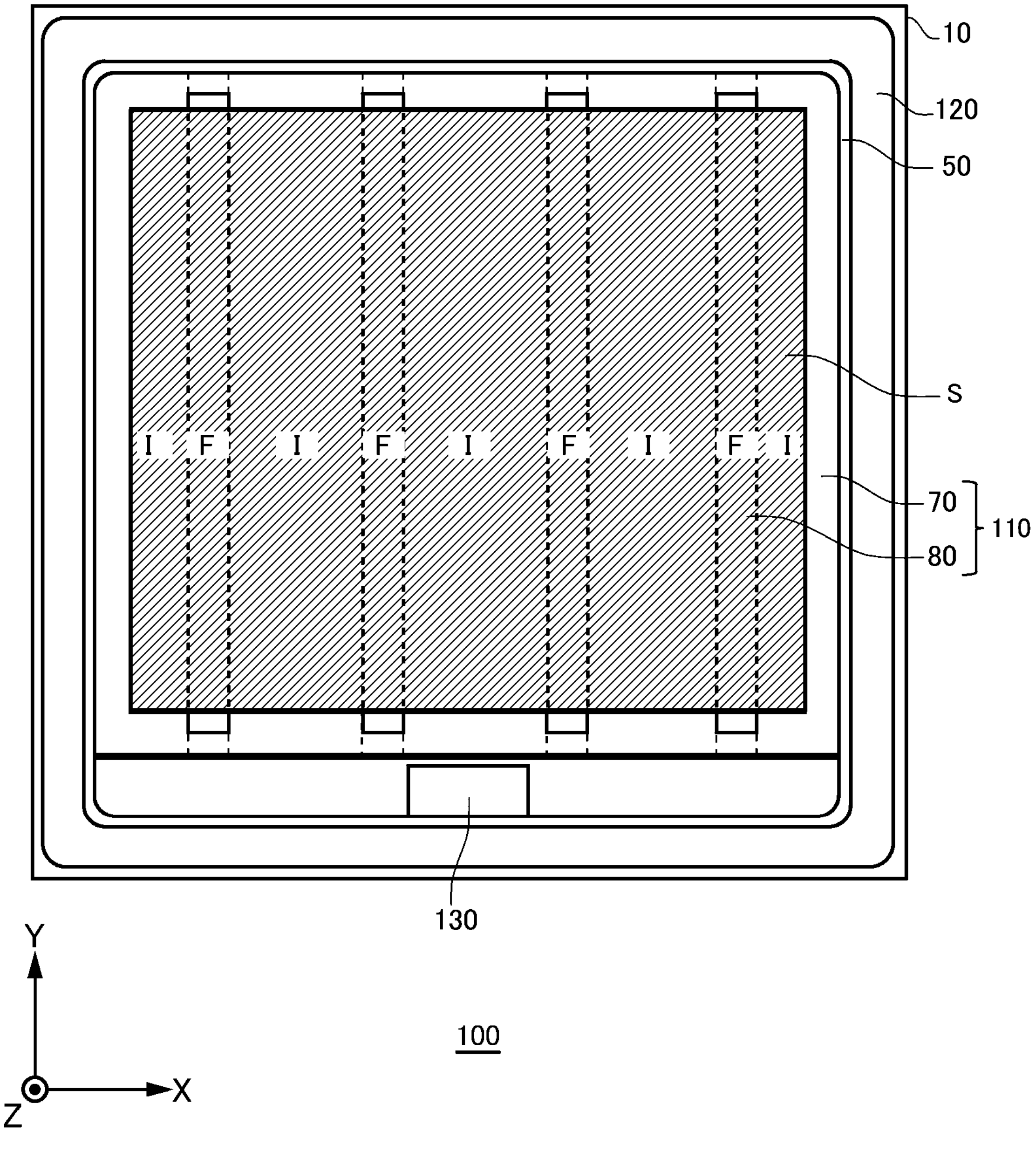
FIG. 5B shows a relationship between an upper surface of the semiconductor device 100 and a junction surface S.

FIG. 5B shows a relationship between the upper surface of the semiconductor device 100 and the junction surface S. The junction surface S of the present example is provided on a partial region of the active region 110. The junction surface S may be provided on the entire active region 110. Although the area ratio between the transistor portions 70 and the diode portions 80 on the front surface 21 has been described in another embodiment example, the area ratio may be read as an area ratio of a junction area between the transistor portions 70 and the coupling portion 240 to a junction area between the diode portions 80 and the coupling portion 240.

That is, the area ratio of the junction area between the transistor portions 70 and the coupling portion 240 to the junction area between the diode portions 80 and the coupling portion 240 may be larger than 2.8 and smaller than 4.7. Moreover, the area ratio of the junction area of the junction surface S may be larger than 3.1 and smaller than 4.7. Further, the area ratio of the junction area of the junction surface S may be larger than 3.2 and smaller than 4.0. The area ratio of the junction area of the junction surface S may be larger than 3.4 and smaller than 3.8. The area ratio of the junction area of the junction surface S may be 3.6.

It is to be noted that the junction area between the transistor portions 70 and the coupling portion 240 may be 80% or more and 120% or less of the junction area between the diode portions 80 and the coupling portion 240. That is, a difference in the surface resistance between the transistor portion 70 and the diode portion 80 may be within ±20%.

While the embodiments of the present invention have been described, the technical scope of the present invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the present invention.

It is to be noted that the operations, procedures, steps, and stages of each process performed by a device, system, program, and method shown in the scope of the claims, specification, or drawings can be performed in any order as long as the order is not indicated by "prior to," "before," or the like and as long as the output from a previous process is not used in a later process. Even if the operation flow is described by using phrases such as "first" or "next" in the scope of the claims, specification, or drawings, it does not necessarily mean that the process must be performed in this order.

EXPLANATION OF REFERENCES

10: semiconductor substrate; 12: emitter region; 14: base region; 15: contact region; 16: accumulation region; 17: well region; 18: drift region; 20: buffer region; 21: front surface; 22: collector region; 23: back surface; 24: collector electrode; 25: connection portion; 30: dummy trench portion; 31: extending portion; 32: dummy dielectric film; 33: connecting portion; 34: dummy conductive portion; 38: interlayer dielectric film; 40: gate trench portion; 41: extending portion; 42: gate dielectric film; 43: connecting portion; 44: gate conductive portion; 50: gate metal layer; 52: emitter electrode; 54: contact hole; 55: contact hole; 56: contact hole; 70: transistor portion; 71: mesa portion; 80: diode portion; 81: mesa portion; 82: cathode region; 90: boundary portion; 91: mesa portion; 100: semiconductor device; 110: active region; 120: outer peripheral region; 130: gate pad; 150: laminated substrate; 151: metal plate; 152: insulating plate; 153: circuit portion; 160: solder portion; 200: semiconductor module; 210: housing; 220: encapsulating resin; 230: external connection terminal; 240: coupling portion; 242: junction portion; 244: solder portion; 246: coupling portion; 570: transistor portion; 580: diode portion.

What is claimed is:

1. A semiconductor device, comprising:
- a transistor portion provided in a semiconductor substrate; and
- a diode portion provided in the semiconductor substrate,
- wherein an area ratio of an area of the transistor portion to an area of the diode portion on a front surface of the semiconductor substrate, defined as a cell pitch ratio of a width of the transistor portion in a predetermined array direction to a width of the diode portion in the array direction, is larger than 3.1 and smaller than 4.7.

2. The semiconductor device according to claim 1, wherein
- the area ratio is larger than 3.2 and smaller than 4.0.

3. The semiconductor device according to claim 1, wherein
- the area ratio is larger than 3.4 and smaller than 3.8.

4. The semiconductor device according to claim 1, wherein
- the area ratio is 3.6.

5. The semiconductor device according to claim 1, wherein
- the transistor portion and the diode portion include a plurality of trench portions arrayed in the predetermined array direction,
- the transistor portion and the diode portion are arrayed alternately in the array direction, and
- a width of the diode portion sandwiched between the transistor portions in the array direction is 200 μm or more.

6. The semiconductor device according to claim 1, comprising:
- a front surface electrode electrically connected to the transistor portion and the diode portion above the semiconductor substrate.

7. A semiconductor module, comprising:
- a semiconductor device including a transistor portion and a diode portion provided in a semiconductor substrate;
- an external connection terminal electrically connected to the semiconductor device; and
- a coupling portion for electrically connecting the semiconductor device and the external connection terminal, wherein
- the coupling portion is in plane contact with a front surface electrode of the semiconductor device at a predetermined junction surface, and
- an area ratio of the transistor portion to the diode portion, defined as a cell pitch ratio of a width of the transistor portion in a predetermined array direction to a width of the diode portion in the array direction, is larger than 2.8 and smaller than 4.7.

8. The semiconductor module according to claim 7, wherein
- the area ratio is larger than 3.1 and smaller than 4.7.

9. The semiconductor module according to claim 7, wherein
- the area ratio is larger than 3.2 and smaller than 4.0.

10. The semiconductor module according to claim 7, wherein
- the area ratio is larger than 3.4 and smaller than 3.8.

11. The semiconductor module according to claim 7, wherein
- the area ratio is 3.6.

12. The semiconductor module according to claim 7, wherein
- the area ratio of the transistor portion to the diode portion is an area ratio of the transistor portion to the diode portion on a front surface of the semiconductor substrate.

13. The semiconductor module according to claim 12, wherein
- the area ratio is larger than 3.1 and smaller than 4.7.

14. The semiconductor module according to claim 12, wherein the area ratio is larger than 3.2 and smaller than 4.0.

15. The semiconductor module according to claim 12, wherein the area ratio is larger than 3.4 and smaller than 3.8.

16. The semiconductor module according to claim 7, wherein the area ratio of the transistor portion to the diode portion is an area ratio of a junction area between the transistor portion and the coupling portion to a junction area between the diode portion and the coupling portion.

17. The semiconductor module according to claim 16, wherein the area ratio is larger than 3.1 and smaller than 4.7.

18. The semiconductor module according to claim 16, wherein the area ratio is larger than 3.2 and smaller than 4.0.

19. The semiconductor module according to claim 16, wherein the area ratio is larger than 3.4 and smaller than 3.8.

20. The semiconductor module according to claim 7, wherein the coupling portion is a lead frame, a ribbon, or a clip.

* * * * *